United States Patent
Sasaki et al.

(10) Patent No.: US 10,920,326 B2
(45) Date of Patent: Feb. 16, 2021

(54) ETCHANT COMPOSITION FOR ETCHING TITANIUM LAYER OR TITANIUM-CONTAINING LAYER, AND ETCHING METHOD

(71) Applicant: Kanto Kagaku Kabushiki Kaisha, Tokyo (JP)

(72) Inventors: Ryou Sasaki, Saitama (JP); Hideki Takahashi, Saitama (JP); Taiga Yokoyama, Tokyo (JP)

(73) Assignee: KANTO KAGAKU KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/497,465

(22) PCT Filed: Mar. 30, 2018

(86) PCT No.: PCT/JP2018/013603
§ 371 (c)(1),
(2) Date: Sep. 25, 2019

(87) PCT Pub. No.: WO2018/181896
PCT Pub. Date: Oct. 4, 2018

(65) Prior Publication Data
US 2020/0024750 A1    Jan. 23, 2020

(30) Foreign Application Priority Data
Mar. 31, 2017 (JP) .............................. JP2017-071076

(51) Int. Cl.
| | | |
|---|---|---|
| C23F 1/20 | (2006.01) | |
| C23F 1/44 | (2006.01) | |
| H01L 21/02 | (2006.01) | |
| H01L 21/28 | (2006.01) | |
| H01L 21/306 | (2006.01) | |
| H01L 21/308 | (2006.01) | |
| H01L 29/786 | (2006.01) | |

(52) U.S. Cl.
CPC .................. *C23F 1/20* (2013.01); *C23F 1/44* (2013.01); *H01L 21/02178* (2013.01); *H01L 21/28* (2013.01); *H01L 21/308* (2013.01); *H01L 21/30604* (2013.01); *H01L 29/786* (2013.01)

(58) Field of Classification Search
CPC ...... C23F 1/20; C23F 1/44; C23F 1/38; H01L 21/02178; H01L 21/28; H01L 21/30604; H01L 21/308; H01L 29/786; H01L 21/32134; H01L 29/66969; H01L 29/7869
See application file for complete search history.

(56) References Cited

U.S. PATENT DOCUMENTS

| | | | |
|---|---|---|---|
| 5,071,510 A * | 12/1991 | Findler | H01L 21/3063 205/656 |
| 9,976,111 B2 * | 5/2018 | Liu | C11D 3/3947 |
| 2010/0320457 A1 | 12/2010 | Matsubara et al. | |
| 2011/0147341 A1 | 6/2011 | Hironosuke et al. | |
| 2011/0230053 A1 | 9/2011 | Matsuda et al. | |
| 2013/0143785 A1 * | 6/2013 | Taniguchi | C11D 11/0047 510/175 |
| 2014/0312265 A1 * | 10/2014 | Chen | H01L 21/02063 252/79.1 |
| 2015/0118860 A1 * | 4/2015 | Muro | H01L 21/30608 438/754 |
| 2015/0255309 A1 | 9/2015 | Nishiwaki et al. | |
| 2015/0368597 A1 | 12/2015 | Eto et al. | |
| 2016/0177457 A1 | 6/2016 | Yokomizo et al. | |

FOREIGN PATENT DOCUMENTS

| | | |
|---|---|---|
| JP | 2002155382 A | 5/2002 |
| JP | 4471094 B | 3/2010 |
| JP | 201333942 A | 2/2013 |
| JP | 2016108659 A | 6/2016 |
| JP | 2016111342 A | 6/2016 |
| WO | WO 2015053800 A1 | 4/2015 |
| WO | 2015108842 A1 | 7/2015 |

* cited by examiner

*Primary Examiner* — Anita K Alanko
(74) *Attorney, Agent, or Firm* — McDonnell Boehnen Hulbert & Berghoff LLP

(57) ABSTRACT

Provided are: an etchant composition for titanium or titanium alloy, the etchant composition being used for selectively etching a titanium layer or titanium-containing layer formed on an oxide semiconductor layer; and an etching method using said etchant composition. The etchant composition according to the present invention, which is used for etching a titanium layer or titanium-containing layer on an oxide semiconductor, comprises: a compound containing ammonium ions; hydrogen peroxide; and a basic compound, wherein the etchant composition has a pH of 7-11.

10 Claims, 1 Drawing Sheet

[Fig. 1]
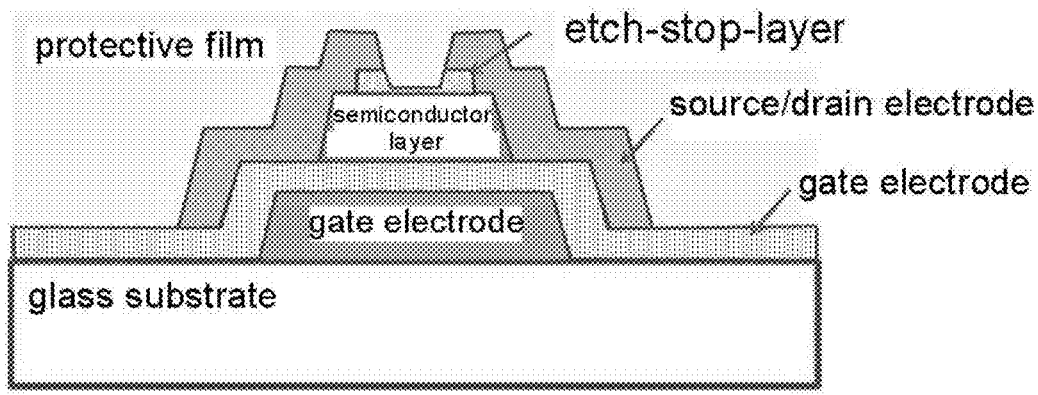
[Fig.2]
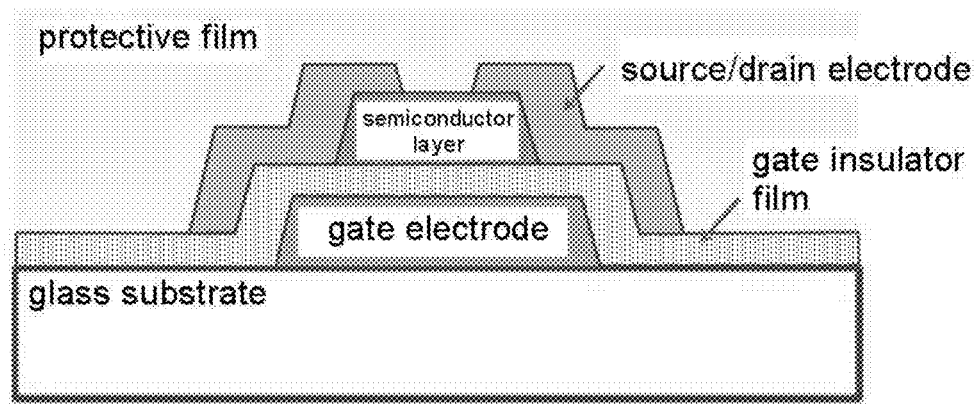

ETCHANT COMPOSITION FOR ETCHING TITANIUM LAYER OR TITANIUM-CONTAINING LAYER, AND ETCHING METHOD

This application is a U.S. National Phase application under 35 U.S.C. § 371 of PCT/JP2018/013603, filed Mar. 30, 2018, which claims priority from and the benefit of Japanese Application No.: 2017-071076, filed on Mar. 31, 2017, the specifications of which are hereby incorporated by reference in their entireties.

TECHNICAL FIELD

The present invention relates to an etchant composition for selectively etching a titanium layer or titanium-containing layer formed on an oxide semiconductor layer and to a method of etching using said etchant composition.

BACKGROUND ARTS

A Thin Film Transistor (hereinbelow also referred to as "TFT") used for, for example, a switching element of a liquid crystal display device generally has a structure provided with a gate electrode on a substrate made of glass, etc., and a gate insulator film covering the gate electrode, and a semiconductor layer formed on a part of the gate insulator film, and a source electrode or a drain electrode formed on both semiconductor layer and gate insulator film. Such structure is called Bottom Gate Top Contact type (hereinbelow referred to as BGTC-type or inverted staggered type), which is widely used in TFTs that use amorphous silicon in the semiconductor layer. Diversion of lines and devices for TFT manufacture using amorphous silicon to the manufacture of TFTs using an oxide semiconductor in the semiconductor layer is possible and most intensively considered. Moreover, Top Gate Top Contact type (TGTC-type, coplanar type) TFT in which the gate electrode is placed in the upper part has also conventionally been used.

As wiring materials for a source electrode or drain electrode, copper and aluminum are often used. Electrode formation is performed by etching the wiring material. Recently, in order to protect the wiring material and to improve its adhesion to the gate insulator film as well as to prevent its migration, titanium or titanium alloy and the wiring material are deposited to form a laminated film before etching.

To date, with respect to the material of the semiconductor layer, TFTs using either polycrystal silicon or amorphous silicon have widely been used. In recent years, however, TFTs using an oxide semiconductor such as IGZO (an oxide constituted by indium/gallium/zinc) in the semiconductor layer are drawing an attention.

TFTs using an oxide semiconductor have higher electron mobility and have superior properties such as decreasing electricity consumption as compared to conventional TFTs. However, processing of an oxide semiconductor is difficult because there is less selectivity between the etching object and the electrode material during etching, as compared to polycrystal silicon and amorphous silicon.

BGTC-type TFTs can be classified, in terms of the methodology of electrode formation, either as etch-stop-layer (ESL)-type (FIG. 1) or as back-channel-etch (BCE)-type (FIG. 2). In the etch-stop-layer-type, an additional layer called an etch-stop-layer is formed between the semiconductor layer and the electrode and to prevent damage to the semiconductor layer caused by etching, though the processes are complicated and costly. On the other hand, the back-channel-etch-type does not form the etch-stop-layer, but may cause damage to the oxide semiconductor, limiting etching method.

Etching of titanium or titanium alloy is normally performed by dry-etching or wet-etching. Dry-etching is expensive in terms of equipment, and can only avoid damage to the semiconductor layer by using etch-stop-layer-type TFTs. On the other hand, wet-etching suppresses the cost and enables a large-scale production.

However, currently, electrode formation on the oxide semiconductor layer is mostly performed with etch-stop-layer-type TFTs, because the oxide semiconductor underlying titanium or titanium alloy tends to be damaged by etching. Although Patent Reference 1 describes etchants comprising hydrogen peroxide, non-fluorine-containing acid and phosphonic acid basic compound as etchant for copper on IGZO, though it does not discuss at all on titanium etching. Patent Reference 2 describes etchants comprising hydrogen peroxide, acids, fluorine ion sources, methylene sulfonate basic compounds, and hydrogen peroxide stabilizing agent as etchant for copper on IGZO, and also discusses on titanium etching, though said etchant is an acidic etchant whose pH is not higher than 5.

On the other hand, as an etchant for titanium, titanium-containing metallic compound or titanium alloy, acidic etchants comprising fluorine ions and etchants comprising hydrogen peroxide have conventionally been known.

As titanium or titanium alloy etchants comprising hydrogen peroxide, etchants comprising hydrogen peroxide, organic amine basic compounds and water-soluble organic solvents (Patent Reference 3); etchants comprising hydrogen peroxide, chelating agents and ammonia or an inorganic acid salts (Patent Reference 4); etchants comprising hydrogen peroxide, an organic acid salts and water (Patent Reference 5); etchants comprising hydrogen peroxide, ammonia compounds and surface uniformizing agents (Patent Reference 6); etchants comprising hydrogen peroxide, nitrogen-containing phosphonic acid basic chelating agents, alkali metal hydroxides and organic acids (Patent Reference 7); etchants comprising hydrogen peroxide, hydroxyl group-containing phosphonic acid, basic compositions and inorganic acid-derived anion species (Patent Reference 8); etchant comprising hydrogen peroxide, alkali metal silicate or bisphosphonate and basic compositions (Patent Reference 9); etchants comprising hydrogen peroxide, hydroxyl group-containing phosphonic acid, basic compositions, anion species and copper-anticorrosive agents (Patent Reference 10); and etchants comprising hydrogen peroxide, phosphoric acid, phosphonic acid and ammonia (Patent Reference 11) have been proposed.

However, none of these references ever discusses on selectively etching titanium, titanium-containing metallic compound or titanium alloy formed on an oxide semiconductor layer. Moreover, phosphonic acid, bisphosphonate and phosphoric acid described in Patent References 7 to 11 were added as chelating agents to improve the stability of hydrogen peroxide.

PRIOR ART REFERENCES

Patent References

[Patent Reference 1] JPA 2016-108659
[Patent Reference 2] JPA 2016-111342
[Patent Reference 3] JP A 2013-33942
[Patent Reference 4] JP A 2002-155382

[Patent Reference 5] International Publication No. WO 2010/029867 pamphlet
[Patent Reference 6] JPA 2014-107434
[Patent Reference 7] International Publication No. WO 2015/002272 pamphlet
[Patent Reference 8] JP B 5344051
[Patent Reference 9] JP A 2016-27186
[Patent Reference 10] International Publication No. WO 2009/081884 pamphlet
[Patent Reference 11] JP B 4471094

SUMMARY OF INVENTION

Problems to be Solved by the Invention

An object of the present invention is, in view of the above-described problems, to provide an etchant for etching a titanium layer or titanium-containing layer formed on an oxide semiconductor layer while suppressing damage to the oxide semiconductor layer, and a method of etching using said etchant.

Means to Solve the Problems

The present inventors made an investigation to solve the above-described problems, and faced problems such as that a conventionally-used etchant for a titanium layer or titanium-containing layer would cause a non-negligible damage on the oxide semiconductor layer. Within the pH region which did not cause a damage to the oxide semiconductor layer, the obtained etching rate for Ti was insufficient. The inventors have made an extensive investigation to solve such problems, and found that, by adjusting the pH of the etchant comprising hydrogen peroxide in the presence of ammonium ions and a basic composition, the etching rate of titanium could be maintained and damage to the oxide semiconductor layer could be suppressed, and that the addition of phosphorus atom-containing oxo acid and/or an ion thereof, and/or, aminocarboxylic acid and/or carboxylic acid could further suppress damage to the oxide semiconductor layer. The inventors have made further investigation and reached the completion of the present invention.

Namely, the present invention relates to the followings:
[1] An etchant composition for etching a titanium layer or titanium-containing layer on an oxide semiconductor, comprising an ammonium ion-containing compound, hydrogen peroxide and a basic composition and having pH between 7 and 11.
[2] The etchant composition according to [1], further comprising a phosphorus atom-containing oxo acid and/or an ion thereof.
[3] The etchant composition according to [1] or [2], further comprising aminocarboxylic acid and/or carboxylic acid.
[4] The etchant composition according to any one of [1] to [3], further comprising a copper-anticorrosive agent.
[5] The etchant composition according to any one of [1] to [4], wherein the concentration of the ammonium ion is between 0.01 and 1.00 mol/L.
[6] The etchant composition according to any one of [1] to [5], wherein the ammonium ion-containing compound is one or more compounds selected from a group consisting of ammonium sulfate, ammonium phosphate, ammonium acetate, ammonium nitrate, ammonium chloride, ammonium succinate and ammonia.
[7] The etchant composition according to [1] to [6], wherein the ammonium ion-containing compound is one or more compounds selected from a group consisting of ammonium sulfate, ammonium phosphate, ammonium acetate, ammonium nitrate, ammonium chloride and ammonium succinate.
[8] The etchant composition according to any one of [1] to [7], wherein the basic composition is selected from a group consisting of an inorganic alkali compound, an quaternary amine hydroxide and an amine.
[9] The etchant composition according to any one of [2] to [8], wherein the concentration of the phosphorus atom-containing oxo acid or ion thereof is between 0.0001 and 1.0 mol/L.
[10] The etchant composition according to any one of [2] to [9], wherein the phosphorus atom-containing oxo acid or an ion thereof is one or more compounds or liberated ions therefrom selected from phosphoric acid, phosphonic acid, multi-site phosphonic acid, phosphinic acid, phosphorous acid and derivatives thereof.
[11] The etchant composition according to any one of [1] to [10], comprising between 0.1 and 40% by mass of the ammonium ion-containing compound, between 5 and 30% by mass of hydrogen peroxide and between 0.05 and 50% by mass of the basic composition.
[12] The etchant composition according to any one of [1] to [11], wherein the oxide semiconductor is selected from a group consisting of a metal oxide comprising indium, gallium and zinc as main ingredients (IGZO), a metal oxide comprising indium and zinc as main ingredients (IZO) and a metal oxide comprising gallium and zinc as main ingredients (GZO).
[13] A method of etching a titanium layer or titanium-containing layer comprising a step of etching the titanium layer or titanium-containing layer on the oxide semiconductor using the etchant composition according to any one of [1] to [12].
[14] A method of manufacturing a thin film transistor comprising a step of etching the titanium layer or titanium-containing layer on the oxide semiconductor using the etchant composition according to any one of [1] to [12].

Effects of the Invention

According to the present invention, an etchant composition that is capable of etching a titanium layer or titanium-containing layer formed on an oxide semiconductor layer while suppressing damage to the oxide semiconductor layer, and a method of etching using said etchant composition can be provided.

In particular, according to the method of etching of the present invention, operating hydrogen peroxide at pH 7 to 11 in the presence of ammonium ions and a basic composition enables etching of titanium at sufficient etching rate while suppressing damage to the oxide semiconductor layer. Thus, it is now possible to etch a titanium layer or titanium-containing layer on an oxide semiconductor layer such as IGZO with a back-channel-etch-type TFT, the etching of which was not possible before, resulting in a significant cost reduction.

Furthermore, according to the method of etching of the present invention, in addition to operating hydrogen peroxide at pH between 7 and 11 in the presence of the ammonium ions and basic composition, by adding a phosphorus atom-containing oxo acid and/or an ion thereof, and/or, aminocarboxylic acid and/or carboxylic acid, it is possible to etch titanium at sufficient etching rate while further suppressing damage to the oxide semiconductor layer.

BRIEF DESCRIPTION OF DRAWINGS

FIG. 1 is a diagram showing the structure of etch-stop-layer (ESL)-type TFT.

FIG. 2 is a diagram showing the structure of back-channel-etch (BCE)-type TFT.

DESCRIPTION OF EMBODIMENTS

Hereinbelow, the present invention will be illustrated in detail based on preferred embodiments of the present invention.

The etchant composition of the present invention is an etchant composition used to selectively etch a titanium layer or titanium-containing layer on the oxide semiconductor.

The oxide semiconductor layer is constituted mainly by materials comprising indium, gallium, zinc and tin, and specific examples include, but not limited to, such as indium/gallium/zinc oxide (IGZO), indium/zinc oxide (IZO) and gallium/zinc oxide (GZO). In the present invention, preferred oxide semiconductor layer is IGZO.

In the present invention, the titanium layer and titanium-containing layer can be formed by, for example, sputtering on the oxide semiconductor. The titanium layer herein refers to a layer made of titanium. Titanium-containing layers include, for example, a Ti alloy layer such as TiW and TiMo, and a layer of a metallic compound comprising Ti as a main ingredient such as TiN.

The etchant composition of the present invention comprises an ammonium ion-containing compound, hydrogen peroxide and a basic composition.

The ammonium ion-containing compound is not particularly limited as long as it is a compound that is capable of liberating an ammonium ion ($NH_4^+$) in solution, though ammonia and ammonium salts are preferred. Ammonium salts, in particular, are preferred because a buffering effect can be expected and pH variation of the solution can be suppressed. As ammonium salts, inorganic acid salts and organic acid salts of ammonium can be contained. Ammonium salts include, but not limited to, such as, for example, ammonium sulfate, ammonium phosphate, ammonium acetate, ammonium nitrate, ammonium chloride, ammonium succinate, ammonium oxalate, ammonium tartrate and ammonium carbonate. In particular, ammonium sulfate, ammonium phosphate, ammonium acetate, ammonium chloride, ammonium nitrate and ammonium succinate are preferred for having low damaging effect on the oxide semiconductor layer. The ammonium salt indicated here includes not only the salts formed by ammonium ion(s) and anion(s) but also those having ammonium ion(s) and other ion(s) than an anion. For example, ammonium phosphate includes ammonium dihydrogen phosphate and diammonium hydrogen phosphate. In general, it is known that various organic acid solution dissolve transparent conductive films such as ITO. Contrary to such knowledge, the etchant composition of the present invention comprising an ammonium salt of an organic acid causes less damage to an oxide semiconductor layer such as IGZO.

The ammonium ion-containing compound may be used alone or in combination of two or more of them. Ammonium carbonate has less damage-suppressing effect as compared with other ammonium salts. Therefore, the present invention in one embodiment does not comprise ammonium carbonate.

The content of the ammonium ion-containing compound is preferably 0.01% by mass or more, more preferably between 0.1 and 10% by mass, and particularly preferably between 0.5 and 5% by mass. Preferably, it is, if being converted to ammonium ions, 0.01 mol/L or more, more preferably between 0.01 and 1.00 mol/L, particularly preferably between 0.05 and 0.8 mol/L. The etching rate of titanium can be increased by increasing the concentration of the ammonium ion-containing compound, whereas the damage to IGZO tends to be gradually increased with increasing ammonium ion concentration even at the same pH. Therefore, the concentration of the ammonium ions in the etchant is particularly preferred to be 1.00 mol/L or less. In view of increasing the selection ratio, the ammonium ion concentration is preferred to be lower.

Basic compositions contained in the etchant composition of the present invention include, but not limited to, for example, inorganic alkali compounds, quaternary amine hydroxides, amines (primary amines, secondary amines, tertiary amines and quaternary amines). Specifically, it includes for example, alkali metal hydroxides such as sodium hydroxide and potassium hydroxide, tetramethylammonium hydroxide (TMAH), aminomethanol, triethanolamine and cholines.

In view of the utility in TFT manufacturing, quaternary amine hydroxides and amines are preferred.

The content of the basic composition is not particularly limited as long as the pH of the etchant composition of the present invention will not exceed 11, though it is preferably 0.01% by mass or more, more preferably between 0.05 and 50.0% by mass, more preferably between 0.1 and 15% by mass. Ammonia also acts as a basic composition because it has an effect of changing pH in relatively large extent. For example, in an etchant composition of the present invention comprising an ammonium salt as an ammonium ion-containing compound, ammonia may be used together as a basic composition. In this case, it is necessary to decide the concentration of ammonium ions taking the total concentration from both the ammonium salt and the ammonium ion-containing compound into account.

The content of the hydrogen peroxide contained in the etchant composition of the present invention will be adjusted as appropriate depending on the type of the titanium layer and titanium-containing layer, film thickness and intended selection ratio, etc., and not particularly limited, though it is preferably 1% by mass or more, more preferably between 5.0 and 30.0% by mass, more preferably between 10 and 25% by mass.

The etchant composition of the present invention comprises, in one embodiment, between 0.1 and 40% by mass of an ammonium ion-containing compound, between 5 and 30% by mass of hydrogen peroxide and between 0.1 and 50% by mass of a basic composition.

The etchant composition of the present invention may further comprise a phosphorus atom-containing oxo acid and/or an ion thereof. Ions of the phosphorus atom-containing oxo acid are ions that have been liberated from the phosphorus atom-containing oxo acid. Inclusion of the phosphorus atom-containing oxo acid and/or ion thereof can further suppress damage to the oxide semiconductor layer. Although the reason why the phosphorus atom-containing oxo acid and/or ion thereof suppresses damage to the oxide semiconductor layer is not entirely clear, it is considered that this is because oxygen ions of the phosphorus atom-containing oxo acid and/or ion thereof are adsorbed to the surface of the oxide semiconductor substrate.

Phosphorus atom-containing oxo acids include, without limitation, for example, phosphoric acid, phosphonic acid, multi-site phosphonic acid, phosphinic acid, phosphorous acid and derivatives thereof. Specific examples of phosphonic acid include, for example, 1-hydroxyethane-1,1-diphosphonic acid (HEDP) and nitrilotris(methylene phosphonate) (ATMP), alendronic acid, phenylphosphonic acid, 2-phosphonobutane-1,2,4-tricarboxylic acid (PBTC), ethylenediamine tetramethylenephosphonic acid (EDTMP). Derivatives of phosphorus atom-containing oxo acids include, for example, phosphate esters and phosphonate esters, including triethyl phosphate and dimethyl phenylphosphonate. In particular, phosphoric acid, HEDP and ATMP are preferred for having low damaging effect on the oxide semiconductor layer. Moreover, a specific example of multi-site phosphonic acid includes bisphosphonate. Multi-site phosphonic acids also act as a chelating agent and have an effect of suppressing the degradation of hydrogen peroxide.

Besides, phosphorus atom-containing oxo acids can be those that are formed by adding phosphoric acid, phosphonic acid, phosphinic acid, bisphosphonate, phosphorous acid and derivatives thereof, etc. to any of the aforementioned ammonium salts. Examples include, without limitation, ammonium dihydrogen phosphate and triammonium phosphate. A similar damage-suppressing effect on the oxide semiconductor layer can be obtained as the case when a phosphorus atom-containing oxo acid and/or an ion thereof is separately added to the ammonium ion-containing compound.

The phosphorus atom-containing oxo acid and/or ion thereof may be used alone or in combination of two or more of them.

The content of the phosphorus atom-containing oxo acid and/or ion thereof is not particularly limited, though it is preferably 1.0 mol/L or less, more preferably 0.75 mol/L or less, further preferably between 0.0001 and 0.5 mol/L.

The etchant composition of the present invention may further comprise an aminocarboxylic acid and/or carboxylic acid. Inclusion of the aminocarboxylic acid and/or carboxylic acid can further suppress damage to the oxide semiconductor layer.

Aminocarboxylic acids include, without limitation, for example, trans-1,2-diaminocyclohexane tetraacetic acid (cyDTA), ethylenediaminetetraacetic acid (EDTA), diethylenetriamine pentaacetic acid, ethylenediamine tetrapropionic acid, triethylene tetramine hexaacetic acid, 1,3-diamino-hydroxypropane-N,N,N',N'-tetraacetic acid, propylenediamine tetraacetic acid, butylenediamine tetraacetic acid, ethylenediamine diacetic acid, ethylenediamine propionic acid, 1,6-hexamethylenediamine-N,N,N', N'-tetraacetic acid, N,N-bis(2-hydroxybenzyl) ethylenediamine-N,N-diacetic acid, diaminopropane tetraacetic acid, 1,4,7,10-tetraazacyclododacane tetraacetic acid, diaminopropanol tetraacetic acid, (hydroxyethyl) ethylene-diamine triacetic acid, iminodiacetic acid, nitrilotriacetic acid, hydroxyethylimino diacetic acid, dihydroxyethyl glycine, glutamic acid diacetic acid and hydroxyethylenediamine triacetic acid. In particular, cyDTA and EDTA are preferred for having low damaging effect on the oxide semiconductor layer.

The content of the aminocarboxylic acid is not particularly limited, though it is preferably 0.01% by mass or more, more preferably between 0.05 and 5% by mass, further preferably between 0.1 and 3% by mass.

Carboxylic acids include, without limitation, for example, succinic acid, formic acid, acetic acid, propionic acid, lactic acid, glycolic acid, diglycolic acid, pyruvic acid, malonic acid, butyric acid, hydroxyacetic acid, tartaric acid, malic acid, maleic acid, fumaric acid, valeric acid, glutaric acid, itaconic acid, adipic acid, caproic acid, citric acid, propanetricarboxylic acid, trans-aconitic acid, enanthic acid, caprylic acid, lauric acid, myristic acid, palmitic acid, stearic acid, oleic acid, linoleic acid, linolenic acid, toluic acid, benzoic acid, 5-benzotriazole carboxylic acid, 1,3-acetone dicarboxylic acid, acetylbenzoic acid, nicotinic acid and picolinic acid. In particular, succinic acid is preferred for having low damaging effect on the oxide semiconductor layer.

The added amount of the carboxylic acid is not particularly limited, though it is preferably 0.001% by mass or more, more preferably between 0.005 and 5% by mass, further preferably between 0.01 and 3% by mass.

In view of further developing the effect of suppressing damage to the oxide semiconductor layer, it is preferred to use the etchant composition comprising aminocarboxylic acid and/or carboxylic acid at or above 50° C.

Since an aminocarboxylic acid and/or carboxylic acid also acts as a chelating agent, it has not only damage-suppressing effect on oxide semiconductor layer, but it also has an effect of improving liquid-stability. In particular, in the manufacture of TFT electrodes, when a titanium layer or titanium-containing layer used as substrate is to be etched, metal wiring materials such as copper and aluminum might be dissolved into the etchant. Metal ions in the etchant sometimes catalytically accelerate the degradation of hydrogen peroxide, which might result in decreased stability of the liquid. Coordinating these metal wiring materials and residual metal ions resulted from etching of the titanium layer or titanium-containing layer with aminocarboxylic acid and/or carboxylic acid (chelating agent) can suppress the degradation of hydrogen peroxide and increase the liquid-stability. In expectation of similar effect, the etchant composition of the present invention may further comprise other chelating agent than aminocarboxylic acid and/or carboxylic acid. Other chelating agents include such as, for example, ethylenediamine, bipyridine and gluconic acid.

The etchant composition of the present invention may further comprise a copper-anticorrosive agent. Copper-anticorrosive agents include, without limitation, 5-amino-1H-tetrazole (ATZ), 3-amino-1,2,4-triazole (ATA), triazole, imidazole, benzimidazole, benzotriazole (BTA), adenine, guanine, 5-phenyltetrazole and nitrogen-containing cyclic compounds such as 5-mercapto-1-methyltetrazole.

The etchant composition of the present invention comprises a solvent. The solvent which may be used includes water and organic solvents such as methanol and isopropanol.

The content of water in the etchant composition is not particularly limited, though it is preferably between 50 and 95% by mass, more preferably between 70 and 85% by mass. Moreover, although the medium which constitutes the etchant composition may comprise other ingredients, it is preferred that it comprise water as main ingredient. In such case, the water content in the medium that constitutes the etchant composition is 80% by mass, further preferably 90% by mass.

The pH of the etchant composition of the present invention is between 7 and 11. Within this pH range, it can achieving an extremely good etching performance, i.e., suppressing damage to the oxide semiconductor and showing a high titanium etching rate. If the pH is below 7, the etching rate for titanium will not be sufficient, or the damage to the oxide semiconductor layer will be increased. If the pH is above 11, the damage to the oxide semiconductor layer will be increased. Moreover, a high pH may sometimes accelerate the degradation of hydrogen peroxide, resulting in an unstable etching rate to titanium. In view of obtaining the highest selection ratio, pH is preferred to be between 8.0 and 9.0.

The pH of the etchant composition of the present invention can be made in a range from pH 7 to 11 by appropriately adjusting the each amount of the ammonium ion-containing compound, hydrogen peroxide and basic composition. For the ease of operability, it is preferred to make an adjustment by the amount of the basic composition. For the adjustment of pH, various inorganic acids, organic acids and salts thereof may be used.

The etchant composition of the present invention can comprises optional ingredients other than the above-mentioned ingredients, unless the etching process of the titanium layer or titanium-containing layer is hindered. Optional ingredients which may be used in the present invention include such as, for example, a surfactant. The addition of a surfactant can result in effects of improving wettability and improving in-plane uniformity. Surfactants include such as, for example, cationic surfactants, anionic surfactants, amphoteric surfactants and nonionic surfactants.

In one embodiment, it is preferred that the etchant composition of the present invention does not comprise a fluorine-containing compound. Fluorine-containing compounds may cause damage to the oxide semiconductor layer.

As mentioned above, the etchant composition of the present invention is used for etching at least one titanium layer or titanium-containing layer on an oxide semiconductor layer; therefore, the selection ratio of the titanium layer or titanium-containing layer to the oxide semiconductor layer is preferred to be larger, and it is preferably 10 or more, more preferably 30 or more, particularly preferably 50 or more.

The etching rate (nm/min) of the etchant composition herein is defined as the amount of the film (nm) etched per treatment time (minutes). The etching rate of the etchant composition of the present invention is not particularly limited, though, when the etchant composition comprises an ammonium ion-containing compound, hydrogen peroxide and a basic composition, under the condition that the temperature at measurement is between 30° C. and 35° C., it is, for titanium layer and titanium-containing layer, preferred to be in a range between 10 and 100 nm/min, more preferably in a range between 20 and 85 nm/min, further preferably in a range between 25 and 75 nm/min. Moreover, under the condition that the temperature at measurement is 50° C., it is preferred to be in a range between 10 and 250 nm/min, more preferably in a range between 20 and 200 nm/min, further preferably in a range between 30 and 150 nm/min.

The etching rate for a titanium layer and titanium-containing layer may be modulated according to the thickness and film characteristics of the titanium layer and titanium-containing layer. For example, it may be modulated by appropriately adjusting at least one in the composition of the etchant composition of the present invention and the temperature at which etching is performed.

The present invention, in one embodiment, relates to a method of etching for etching a titanium layer or titanium-containing layer on an oxide semiconductor layer using the above-mentioned etchant composition.

The temperature of the etchant composition at the time of etching is not particularly limited, though it is preferably 25° C. or higher. In view of the stability of hydrogen peroxide and performing a stable etching, it is more preferably between 30 and 50° C., further preferably between 30 and 40° C.

In the method of etching of the present invention, the method for applying the etchant of the present invention to the titanium layer or titanium-containing layer is not particularly limited, and includes, for example, immersing and spraying.

The method of etching of the present invention is particularly suitable for use in etching a titanium layer or titanium-containing layer on an oxide semiconductor layer in the process of making an electrode in manufacturing a thin film transistor.

For illustration using one example of the process of making an electrode of a BGTC-type thin film transistor, the method of etching of the present invention may be applied to the etching of a back-channel-etch (BCE)-type TFT. FIG. 2 shows the structure of a back-channel-etch (BCE)-type after electrode formation; before electrode formation, a laminated film of metal wires and the titanium layer or titanium-containing layer has been formed on the oxide semiconductor layer. In general, for the purpose of protecting wiring materials and improving adhesion, the titanium layer or titanium-containing layer has been formed below, or both above and below, the wiring materials, and these are to be etched in order from the top. According to the method of etching of the present invention, the titanium layer(s) or titanium-containing layer(s) in contact with the oxide semiconductor layer can be etched while damage to the oxide semiconductor layer is suppressed. This enables cutting off the etch-stop-layer which otherwise is provided in an etch-stop-layer-type TFT in FIG. 1, significantly decreasing costs.

The etchant composition and method of etching of the present invention are also useful in TGTC-type thin film transistor.

As above, the present invention has been explained in detail based on preferred embodiments, though the present invention is not limited to these, and each constituent may be substituted with any substituent that can exhibit similar function, or any constituents may be added.

EXAMPLES

The present invention will be expressed in further detail along with following Working Examples and Comparative Examples, though the present invention is not limited to these Working Examples.

Experiments were carried out according to following methods using the etchant composition of the present invention and the etchant composition for comparison (for the concentration of the ammonium ion-containing compound in Tables, for example, when the concentration of $(NH_4)_2SO_4$ is 0.3 M, it can be converted to 0.6 mol/L of ammonium ions).

Method of Assessing Titanium Etching Rate (Working Examples 1-31 and Comparative Examples 1-4)

On a glass substrate, 50 nm of titanium film was produced, which is then coated with a resist, and the substrate was patterned by photolithography and cut into 10 mm×10 mm in size. The etchant composition was prepared and placed in warm bath 35° C. for 15 min, the cut substrate was horizontally immersed in approximately 40 mL of each etchant composition, stirred and etched at 35° C. Disappearance of the film was confirmed by visual observation, time from the initiation to the completion of etching (Just Etching Time: JET) was measured, and the etching rate was calculated. The etched substrate was washed with ultrapure water, dried under nitrogen gas stream.

Method of Assessing Titanium Etching Rate (Working Examples 32-41 and Comparative Examples 5-9)

On a glass substrate, 50 nm of titanium film was produced, which is then coated with a resist, and the substrate was patterned by photolithography and cut into 10 mm×10 mm in size. The etchant composition was prepared and placed in warm bath at 30° C. for 30 min, the cut substrate was horizontally immersed in approximately 50 mL of each etchant composition, stirred and etched at 30° C. Disappearance of the film was confirmed by visual observation, time from the initiation to the completion of etching (Just Etching Time: JET) was measured, and the etching rate was calculated. The etched substrate was washed with ultrapure water, dried under nitrogen gas stream.

Method of Assessing Titanium Etching Rate (Working Examples 42-43 and Comparative Example 10)

On a glass substrate, 50 nm of titanium film was produced, which is then coated with a resist, and the substrate was patterned by photolithography and cut into 10 mm×10 mm in size. The etchant composition was prepared and placed in warm bath at 50° C. for 30 min, the cut substrate was horizontally immersed in approximately 50 mL of each etchant composition, stirred and etched at 50° C. Disappearance of the film was confirmed by visual observation, time from the initiation to the completion of etching (Just Etching Time: JET) was measured, and the etching rate was calculated. The etched substrate was washed with ultrapure water, dried under nitrogen gas stream.

Method of Assessing IGZO Etching Rate (Working Examples 1-31 and Comparative Examples 1-4)

On a glass substrate, 50 nm of IGZO was produced, which is then coated with a resist, and the substrate was patterned by photolithography and cut into 10 mm×10 mm in size. The etchant composition was prepared and placed in warm bath 35° C. for 15 min, the substrate was perpendicularly immersed for 5 min in approximately 40 mL of each etchant composition, etching was performed at 35° C. without stirring. The etched substrate was washed with ultrapure water, dried under nitrogen gas stream. The resist was exfoliated by immersing in acetone at 35° C. for 90 sec with stirring. The acetone-immersed substrate was washed with ultrapure water, dried under nitrogen gas stream. For the etched substrate, the amount etched was measured using probe-type step profiler (DektakXT from BrukerAXS), and the etching rate was calculated.

Method of Assessing IGZO Etching Rate (Working Examples 32-41 and Comparative Examples 5-9)

On a glass substrate, 50 nm of IGZO was produced, which is then coated with a resist, and the substrate was patterned by photolithography and cut into 10 mm×10 mm in size. The etchant composition was prepared and placed in warm bath at 30° C. for 30 min, the substrate was perpendicularly immersed for 5 min in approximately 50 mL of each etchant composition, etching was performed at 30° C. without stirring. The etched substrate was washed with ultrapure water, dried under nitrogen gas stream. The resist was exfoliated by immersing in acetone at 35° C. for 90 sec with stirring. The acetone-immersed substrate was washed with ultrapure water, dried under nitrogen gas stream. For the etched substrate, the amount etched was measured using probe-type step profiler (DektakXT from BrukerAXS), and the etching rate was calculated.

Method of Assessing IGZO Etching Rate (Working Examples 42-43 and Comparative Example 10)

On a glass substrate, 50 nm of IGZO was produced, which is then coated with a resist, and the substrate was patterned by photolithography and cut into 10 mm×10 mm in size. The resist was exfoliated by immersing in acetone at 35° C. for 90 sec with stirring. The etchant composition was prepared and placed in warm bath at 50° C. for 30 min, the substrate was perpendicularly immersed for 5 min in approximately 50 mL of each etchant composition, etching was performed at 50° C. without stirring. The etched substrate was washed with ultrapure water, dried under nitrogen gas stream. The etching rate was calculated by measuring the amount etched by using energy dispersion-type X-ray fluorescence spectrometer (HITACHI FT9500X) for the substrate before and after the etching.

When an energy dispersion-type X-ray fluorescence spectrometer is used, comparison of absolute values with those of the case using probe-type step profiler is not available, because the absolute measurement value of the amount etched under identical etching conditions becomes smaller due to the difference in measurement principle. However, it is still needless to say that the magnitude relation of measurement values is the same.

In Table 1, the constitution of the etchant compositions used in each of Working Examples 1-5, as well as etching rates (E/R) and the selection ratio for the etching of titanium and IGZO are shown.

TABLE 1

| | | Composition | | | Results | | |
|---|---|---|---|---|---|---|---|
| | | $H_2O_2$ | Compound comprising ammonium ions | | Basic | | |
| | pH | content[1] (wt %) | Compound | Concentration[1] (M) | compound (pH adjuster) | Ti E/R | IGZO E/R | Selection ratio |
| Working Example 1 | 9.0 | 5.0 | $(NH_4)_2HPO_4$ | 0.3 | KOH | 10.9 | 0.4 | 27.3 |
| Working Example 2 | 9.0 | 10.0 | $(NH_4)_2HPO_4$ | 0.3 | KOH | 25.6 | 0.5 | 51.2 |
| Working Example 3 | 9.0 | 15.0 | $(NH_4)_2HPO_4$ | 0.3 | KOH | 40.0 | 0.7 | 57.1 |

TABLE 1-continued

| | | Composition | | | | Results | | |
|---|---|---|---|---|---|---|---|---|
| | | $H_2O_2$ | Compound comprising ammonium ions | | Basic | | | |
| | pH | content[1] (wt %) | Compound | Concentration[1] (M) | compound (pH adjuster) | Ti E/R | IGZO E/R | Selection ratio |
| Working Example 4 | 9.0 | 20.0 | $(NH_4)_2HPO_4$ | 0.3 | KOH | 62.5 | 0.9 | 69.4 |
| Working Example 5 | 9.0 | 25.0 | $(NH_4)_2HPO_4$ | 0.3 | KOH | 75.0 | 0.9 | 83.3 |

[1]Value at preparation when the solution at the time of adjustment was made 40 ml (40 g, specific gravity = 1.0)

In Table 2, the constitution of the etchant compositions used in Working Example 6 and Comparative Examples 1 and 2, as well as titanium etching rates (E/R) are shown. In Comparative Examples 1 and 2 which do not comprise no ammonium ion, the etching rate was decreased.

TABLE 2

| | | Composition | | | | | | Results | |
|---|---|---|---|---|---|---|---|---|---|
| | | $H_2O_2$ | Additive 1 | | Additive 2 | | Basic | | |
| | pH | content[1] (wt %) | Compound | Conc.[1] (M) | Compound | Conc. 1 (M) | compound (pH adjuster) | Cations in system | Ti E/R (nm/min) |
| Working Example 6 | 9.0 | 20.0 | $(NH_4)_2HPO_4$ | 0.3 | None | — | KOH | $NH_4^+$, $K^+$ | 61.2 |
| Comparative Example 1 | 9.0 | 20.0 | $H_3PO_4$ | 0.3 | None | — | KOH | $K^+$ | 50.0 |
| Comparative Example 2 | 9.0 | 20.0 | $H_3PO_4$ | 0.3 | TMAH | 0.3 | KOH | $TMA^+$, $K^+$ | 30.3 |

[1]Value at preparation when the solution at the time of adjustment was made 40 ml (40 g, specific gravity = 1.0)

In Table 3, the constitution of the etchant compositions used in Working Examples 7-14, as well as IGZO etching rates (E/R) are shown. Besides, in order to unify the content of ammonium ions, ammonia was added in some of the compositions.

TABLE 3

| | | Composition | | | | | | Results |
|---|---|---|---|---|---|---|---|---|
| | | $H_2O_2$ | Compound comprising ammonium ions | | Additive | | Basic | IGZO |
| | pH | content[1] (wt %) | Compound | Conc.[1] (M) | Compound | Conc.[1] (M) | compound (pH adjuster) | E/R (nm/min) |
| Workng Example 7 | 9.0 | 20.0 | $(NH_4)_2SO_4$ | 0.3 | None | — | KOH | 1.7 |
| Working Example 8 | 9.0 | 20.0 | $(NH_4)_2HPO_4$ | 0.3 | None | — | KOH | 0.7 |
| Working Example 9 | 9.0 | 20.0 | $CH_3COONH_4$ | 0.3 | $NH_3$ | 0.3 | KOH | 1.1 |
| Working Example 10 | 9.0 | 20.0 | $NH_4Cl$ | 0.3 | $NH_3$ | 0.3 | KOH | 2.4 |
| Working Example 11 | 9.0 | 20.0 | $NH_4NO_3$ | 0.3 | $NH_3$ | 0.3 | KOH | 1.1 |
| Working Example 12 | 9.0 | 20.0 | monoammonium succinate | 0.3 | None | — | KOH | 1.4 |
| Working Example 13 | 9.0 | 20.0 | ammonium oxalate | 0.3 | None | — | KOH | 5.1 |

TABLE 3-continued

| | | Composition | | | | | Results |
| --- | --- | --- | --- | --- | --- | --- | --- |
| | $H_2O_2$ | | Compound comprising ammonium ions | | Additive | Basic | IGZO |
| | pH | content[1] (wt %) | Compound | Conc.[1] (M) | Compound | Conc.[1] (M) | compound (pH adjuster) | E/R (nm/min) |
| Working Example 14 | 9.0 | 20.0 | ammonium tartrate | 0.3 | None | — | KOH | 5.6 |

[1]Value at preparation when the solution at the time of adjustment was made 40 ml (40 g, specific gravity = 1.0)

In Table 4, the constitution of the etchant compositions used in Working Examples 15-19, as well as titanium etching rates, IGZO etching rates (E/R) and selection ratios are shown. It was recognized that the selection ratio tended to be larger in those with lower concentration of the ammonium ions.

TABLE 4

| | Composition | | | | | Results | | |
| --- | --- | --- | --- | --- | --- | --- | --- | --- |
| | $H_2O_2$ | | Compound comprising ammonium ions | | Basic | | IGZO | |
| | pH | content[1] (wt %) | Compound | Conc.[1] (M) | compound (pH adjuster) | Ti E/R (nm/min) | E/R (nm/min) | Selection ratio |
| Working Example 15 | 9.0 | 20.0 | $(NH_4)_2SO_4$ | 0.1 | KOH | 53.6 | 0.5 | 107.2 |
| Working Example 16 | 9.0 | 20.0 | $(NH_4)_2SO_4$ | 0.3 | KOH | 66.7 | 1.2 | 55.6 |
| Working Example 17 | 9.0 | 20.0 | $(NH_4)_2SO_4$ | 0.5 | KOH | 71.4 | 2.1 | 34.0 |
| Working Example 18 | 9.0 | 20.0 | $(NH_4)_2SO_4$ | 1.0 | KOH | 81.1 | 5.0 | 16.2 |
| Working Example 19 | 9.0 | 20.0 | $(NH_4)_2SO_4$ | 1.5 | KOH | 81.1 | 8.7 | 9.3 |

[1]Value at preparation when the solution at the time of adjustment was made 40 ml (40 g, specific gravity = 1.0)

In Table 5, the constitution of the etchant compositions used in Working Examples 20-24, as well as titanium etching rates, IGZO etching rates (E/R) and selection ratios are shown. It was recognized that titanium can be etched with high selection ratio using any of the basic compositions.

TABLE 5

| | Composition | | | | | Results | | |
| --- | --- | --- | --- | --- | --- | --- | --- | --- |
| | $H_2O_2$ | | Compound comprising ammonium ions | | Basic | | IGZO | |
| | pH | content[1] (wt %) | Compound | Conc.[1] (M) | compound (pH adjuster) | Ti E/R (nm/min) | E/R (nm/min) | Selection ratio |
| Working Example 20 | 9.0 | 20.0 | $(NH_4)_2HPO_4$ | 0.3 | KOH | 55.6 | 0.6 | 92.7 |
| Working Example 21 | 9.0 | 20.0 | $(NH_4)_2HPO_4$ | 0.3 | TMAH | 36.1 | 0.6 | 60.2 |

TABLE 5-continued

| | | Composition | | | | Results | | |
| --- | --- | --- | --- | --- | --- | --- | --- | --- |
| | | $H_2O_2$ | Compound comprising ammonium ions | | Basic | | IGZO | |
| | pH | content[1] (wt %) | Compound | Conc.[1] (M) | compound (pH adjuster) | Ti E/R (nm/min) | E/R (nm/min) | Selection ratio |
| Working Example 22 | 9.0 | 20.0 | $(NH_4)_2HPO_4$ | 0.3 | Choline | 53.6 | 0.8 | 67.0 |
| Working Example 23 | 9.0 | 20.0 | $(NH_4)_2HPO_4$ | 0.3 | MEA | 43.5 | 1.0 | 43.5 |
| Working Example 24 | 9.0 | 20.0 | $(NH_4)_2HPO_4$ | 0.3 | $NH_3$ | 76.9 | 1.5 | 51.3 |

[1]Value at preparation when the solution at the time of adjustment was made 40 ml (40 g, specific gravity = 1.0)

In Table 6, the constitution of the etchant compositions used in Working Examples 25-31 and Comparative Examples 3 and 4, as well as titanium etching rates, IGZO etching rates (E/R) and selection ratios are shown. The etchant composition with pH>11 causes significant damage to IGZO. Moreover, the selection ratio was highest at pH between 8.0 and 9.0.

TABLE 6

| | | Composition | | | | Results | | |
| --- | --- | --- | --- | --- | --- | --- | --- | --- |
| | | $H_2O_2$ | Compound comprising ammonium ions | | Basic | | IGZO | |
| | pH | content[1] (wt %) | Compound | Conc.[1] (M) | compound (pH adjuster) | Ti E/R (nm/min) | E/R (nm/min) | Selection ratio |
| Working Example 25 | 8.0 | 20.0 | $(NH_4)_2HPO_4$ | 0.3 | KOH | 28.8 | 0.4 | 72.0 |
| Working Example 26 | 8.5 | 20.0 | $(NH_4)_2HPO_4$ | 0.3 | KOH | 44.8 | 0.4 | 112.0 |
| Working Example 27 | 9.0 | 20.0 | $(NH_4)_2HPO_4$ | 0.3 | KOH | 66.7 | 0.6 | 111.2 |
| Working Example 28 | 9.5 | 20.0 | $(NH_4)_2HPO_4$ | 0.3 | KOH | 83.3 | 1.6 | 52.1 |
| Working Example 29 | 10.0 | 20.0 | $(NH_4)_2HPO_4$ | 0.3 | KOH | 100.0 | 2.6 | 38.5 |
| Working Example 30 | 10.5 | 20.0 | $(NH_4)_2HPO_4$ | 0.3 | KOH | 115.4 | 3.6 | 32.1 |
| Working Example 31 | 11.0 | 20.0 | $(NH_4)_2HPO_4$ | 0.3 | KOH | 125.0 | 4.4 | 28.4 |
| Comparative Example 3 | 11.5 | 20.0 | $(NH_4)_2HPO_4$ | 0.3 | KOH | 115.4 | 5.8 | 19.9 |
| Comparative Example 4 | 12.0 | 20.0 | $(NH_4)_2HPO_4$ | 0.3 | KOH | 71.4 | 7.6 | 9.4 |

[1]Value at preparation when the solution at the time of adjustment was made 40 ml (40 g, specific gravity = 1.0)

In Table 7, the constitution of the etchant compositions used in Working Examples 32-34 and Comparative Example 5, as well as titanium etching rates, IGZO etching rates (E/R) and selection ratios are shown. It was confirmed that the addition of phosphorus atom-containing oxo acid suppressed damage to IGZO.

TABLE 7

| | | Composition | | | | | Results | | |
|---|---|---|---|---|---|---|---|---|---|
| | | H$_2$O$_2$ | Compound comprising ammonium ions | | Basic compound | Phosphorus atom-containing oxo acid | | | |
| | pH | content[1] (wt %) | Compound | Conc.[1] (M) | (pH adjuster) | Compound | Conc.[1] (M) | Ti E/R (nm/min) | IGZO E/R (nm/min) | Selection ratio |
| Comparative Example 5 | 8.5 | 21.3 | (NH$_4$)$_2$SO$_4$ | 0.3 | TMAH | None | — | 66.7 | 2.6 | 25.8 |
| Working Example 32 | 8.5 | 21.3 | (NH$_4$)$_2$SO$_4$ | 0.3 | TMAH | Phosphoric acid | 0.05 | 66.7 | 0.7 | 92.6 |
| Working Example 33 | 8.5 | 21.3 | (NH$_4$)$_2$SO$_4$ | 0.3 | TMAH | HEDP | 0.05 | 66.7 | 0.6 | 119.1 |
| Working Example 34 | 8.5 | 21.3 | (NH$_4$)$_2$SO$_4$ | 0.3 | TMAH | ATMP | 0.05 | 66.7 | 0.9 | 74.9 |

[1]Value at preparation when the solution at the time of adjustment was made 50 ml (50 g, specific gravity = 1.0)

In Table 8, the constitution of the etchant compositions used in Working Examples 35-37 and Comparative Example 6, as well as titanium etching rates, IGZO etching rates (E/R) and selection ratios are shown. It was confirmed that the addition of phosphorus atom-containing oxo acid suppressed damage to IGZO even in the presence of an anion such as oxalate ion which could cause large IGZO damage, and that the selection ratio was increased by 10 times or more by adding HEDP as compared with the case where no phosphorus atom-containing oxo acid was added.

TABLE 8

| | | Composition | | | | | Results | | |
|---|---|---|---|---|---|---|---|---|---|
| | | H$_2$O$_2$ | Compound comprising ammonium ions | | Basic compound | Phosphorus atom-containing oxo acid | | | |
| | pH | content[1] (wt %) | Compound | Conc.[1] (M) | (pH adjuster) | Compound | Conc.[1] (M) | Ti E/R (nm/min) | IGZO E/R (nm/min) | Selection ratio |
| Comparative Example 6 | 8.5 | 21.3 | ammonium oxalate | 0.3 | TMAH | None | — | 66.7 | 7.8 | 8.6 |
| Working Example 35 | 8.5 | 21.3 | ammonium oxalate | 0.3 | TMAH | Phosphoric acid | 0.05 | 66.7 | 1.3 | 49.8 |
| Working Example 36 | 8.5 | 21.3 | ammonium oxalate | 0.3 | TMAH | HEDP | 0.05 | 66.7 | 0.7 | 96.9 |
| Working Example 37 | 8.5 | 21.3 | ammonium oxalate | 0.3 | TMAH | ATMP | 0.05 | 66.7 | 1.5 | 44.2 |

[1]Value at preparation when the solution at the time of adjustment was made 50 ml (50 g, specific gravity = 1.0)

In Table 9, the constitution of the etchant compositions used in Working Examples 38-41 and Comparative Examples 7-9, as well as titanium etching rates, IGZO etching rates (E/R) and selection ratios are shown. It was confirmed that the addition of phosphoric acid or phosphonic acid to ammonium salt instead of phosphorus atom-containing oxo acid could led to a similar IGZO damage-suppressing effect to the addition of phosphorus atom-containing oxo acid.

TABLE 9

| | | Composition | | | | | | |
|---|---|---|---|---|---|---|---|---|
| | | H$_2$O$_2$ | Compound comprising ammonium ions | | Basic compound 1 | Basic compound 2 | Phosphorus atom-containing oxo acid | |
| | pH | content[1] (wt %) | Compond | Conc.[1] (M) | (pH adjuster) | (pH adjuster) | Compound | Conc.[1] (M) |
| Comparative Example 7 | 8.5 | 21.3 | (NH$_4$)$_2$SO$_4$ | 0.15 | MEA | TMAH | None | — |

TABLE 9-continued

| | | | | | | | | | |
|---|---|---|---|---|---|---|---|---|---|
| Comparative Example 8 | 8.5 | 21.3 | monoammonium succinate | 0.15 | MEA | TMAH | None | — | |
| Comparative Example 9 | 8.5 | 21.3 | ammonium tartrate | 0.15 | MEA | TMAH | None | — | |
| Working Example 38 | 8.5 | 21.3 | $(NH_4)_2HPO_4$ | 0.15 | MEA | TMAH | None | — | |
| Working Example 39 | 8.5 | 21.3 | $(NH_4)_2PO_4$ | 0.15 | MEA | TMAH | None | — | |
| Working Example 40 | 8.5 | 21.3 | $(NH_4)_2SO_4$ | 0.15 | MEA | TMAH | Phosphoric acid | 0.05 | |
| Working Example 41 | 8.5 | 21.3 | $(NH_4)_2SO_4$ | 0.15 | MEA | TMAH | HEDP | — | |

| | Composition | | | | Results | | |
|---|---|---|---|---|---|---|---|
| | Chelating agent | | copper-anticorrosive agent | | Ti | IGZO | |
| | Compound | Conc.[1] (M) | Compound | Content (wt %)[1] | E/R (nm/min) | E/R (nm/min) | Selection ratio |
| Comparative Example 7 | CyDTA | 0.02 | ATZ | 0.06 | 42.9 | 3.70 | 11.6 |
| Comparative Example 8 | CyDTA | 0.02 | ATZ | 0.06 | 42.9 | 4.11 | 10.4 |
| Comparative Example 9 | CyDTA | 0.02 | ATZ | 0.06 | 40.0 | 4.09 | 9.8 |
| Working Example 38 | CyDTA | 0.02 | ATZ | 0.06 | 40.0 | 0.71 | 56.3 |
| Working Example 39 | CyDTA | 0.02 | ATZ | 0.06 | 40.0 | 0.78 | 51.3 |
| Working Example 40 | CyDTA | 0.02 | ATZ | 0.06 | 40.0 | 0.72 | 55.6 |
| Working Example 41 | CyDTA | 0.02 | ATZ | 0.06 | 40.0 | 0.76 | 52.6 |

[1]Value at preparation when the solution at the time of adjustment was made 50 ml (50 g, specific gravity = 1.0)

In Table 10, the constitution of the etchant compositions used in Working Examples 42-43 and Comparative Example 10, as well as titanium etching rates, IGZO etching rates (E/R) and selection ratios are shown.

It was confirmed that the addition of carboxylic acid or aminocarboxylic acid could suppress damage to IGZO.

TABLE 10

| | | Composition | | | | | Results | | |
|---|---|---|---|---|---|---|---|---|---|
| | | H₂O₂ content[1] (wt %) | Compound comprising ammonium ions Compound | Conc.[1] (M) | Basic compound (pH adjuster) | Aminocarboxylic/ carboxylic acid Compound | Conc.[1] (M) | Ti E/R (nm/min) | IGZO E/R (nm/min) | Selection ratio |
| | pH | | | | | | | | | |
| Comparative Example 10 | 9.0 | 20.0 | $(NH_4)_2SO_4$ | 0.3 | TMAH | None | — | 130.4 | 1.18 | 110.5 |
| Working Example 42 | 9.0 | 200 | $(NH_4)_2SO_4$ | 0.3 | TMAH | Succinic acid | 0.05 | 130.4 | 0.82 | 159.1 |
| Working Example 43 | 9.0 | 20.0 | $(NH_4)_2SO_4$ | 0.3 | TMAH | EDTA | 0.05 | 130.4 | 0.77 | 169.4 |

[1]Value at preparation when the solution at the time of adjustment was made 50 ml (50 g, specific gravity = 1.0)

INDUSTRIAL APPLICABILITY

Using the etchant composition of the present invention, it is possible to etch a layer consisting of titanium or a layer comprising titanium on an oxide semiconductor while causing very little damage to the oxide semiconductor.

The invention claimed is:

1. An etchant composition for etching a titanium layer or titanium-containing layer on an oxide semiconductor, comprising an ammonium ion-containing compound, hydrogen peroxide, a basic composition, and phosphorus atom-containing oxo acid and/or an ion thereof, wherein the ammonium ion-containing compound is one or more compounds selected from a group consisting of ammonium sulfate, ammonium phosphate, ammonium acetate, ammonium nitrate, ammonium chloride and ammonium succinate, wherein the basic composition is selected from a group consisting of an inorganic alkali compound, quaternary amine hydroxide and an amine, and having pH between 7 and 11.

2. The etchant composition of claim 1, further comprising aminocarboxylic acid and/or carboxylic acid.

3. The etchant composition of claim 1, further comprising a copper-anticorrosive agent.

4. The etchant composition of claim 1, wherein the concentration of the ammonium ion is between 0.01 to 1.00 mol/L.

5. The etchant composition of claim 1, wherein the concentration of the phosphorus atom-containing oxo acid or ion thereof is between 0.0001 and 1.0 mol/L.

6. The etchant composition of claim 1, wherein the phosphorus atom-containing oxo acid or an ion thereof is one or more compounds or liberated ions therefrom selected from phosphoric acid, phosphonic acid, multi-site phosphonic acid, phosphinic acid, phosphorous acid and derivatives thereof.

7. The etchant composition of claim 1, comprising between 0.1 and 40% by mass of the ammonium ion-containing compound, between 5 and 30% by mass of hydrogen peroxide and between 0.1 and 50% by mass of the basic composition.

8. The etchant composition of claim 1, wherein the oxide semiconductor is selected from a group consisting of a metal oxide comprising indium, gallium and zinc as main ingredients (IGZO), a metal oxide comprising indium and zinc as main ingredients (IZO) and a metal oxide comprising gallium and zinc as main ingredients (GZO).

9. A method of etching a titanium layer or titanium-containing layer, comprising a step of etching the titanium layer or titanium-containing layer on the oxide semiconductor using the etchant composition of claim 1.

10. A method of manufacturing a thin film transistor, comprising a step of etching the titanium layer or titanium-containing layer on the oxide semiconductor using the etchant composition of claim 1.

\* \* \* \* \*